United States Patent
Lin et al.

(10) Patent No.: US 12,439,729 B2
(45) Date of Patent: Oct. 7, 2025

(54) HETEROJUNCTION SOLAR CELL AND MANUFACTURING METHOD THEREOF

(71) Applicant: Gold Stone (Fujian) Energy Company Limited, Quanzhou (CN)

(72) Inventors: Chaohui Lin, Quanzhou (CN); Kairui Lin, Quanzhou (CN)

(73) Assignee: GOLD STONE (FUJIAN) ENERGY COMPANY LIMITED, Quanzhou (CN)

( * ) Notice: Subject to any disclaimer, the term of this patent is extended or adjusted under 35 U.S.C. 154(b) by 105 days.

(21) Appl. No.: 18/241,288

(22) Filed: Sep. 1, 2023

(65) Prior Publication Data
US 2024/0079505 A1    Mar. 7, 2024

(30) Foreign Application Priority Data

Sep. 1, 2022    (CN) .................... 202211066022.9
Sep. 30, 2022   (CN) .................... 202211209200.9

(51) Int. Cl.
*H10F 77/30*     (2025.01)
*H10F 10/17*     (2025.01)
*H10F 71/00*     (2025.01)

(52) U.S. Cl.
CPC ........... *H10F 77/311* (2025.01); *H10F 10/17* (2025.01); *H10F 71/1221* (2025.01)

(58) Field of Classification Search
None
See application file for complete search history.

(56) References Cited

U.S. PATENT DOCUMENTS

2008/0302416 A1*  12/2008  Wolfe .................. H10F 10/19
                                                        136/256
2012/0055547 A1*  3/2012   Schultz-Wittmann .....................
                                                        H10F 10/165
                                                        136/258

(Continued)

FOREIGN PATENT DOCUMENTS

CN       102280502 A       12/2011
CN       104733557 A       6/2015

(Continued)

OTHER PUBLICATIONS

Hyunjung Park, et al., Tunnel oxide passivating electron contacts for high-efficiency n-type silicon solar cells with amorphous silicon passivating hole contacts, Progress in Photovoltaics: Research and Applications, 2019, pp. 1104-1114.

(Continued)

*Primary Examiner* — Ryan S Cannon
(74) *Attorney, Agent, or Firm* — Bayramoglu Law Offices LLC

(57) ABSTRACT

A heterojunction solar cell and a manufacturing method thereof are provided. The manufacturing method includes the following steps: A: forming a tunnel oxide layer on a first main surface of a semiconductor substrate; B: forming a first intrinsic polysilicon layer on the tunnel oxide layer; C: forming the first intrinsic polysilicon layer into a P-type polysilicon layer by diffusion annealing; D: removing a borosilicate glass (BSG) layer formed by the diffusion annealing; E: forming a mask layer on the P-type polysilicon layer; F: performing texturing and cleaning on a second main surface of the semiconductor substrate, and removing the mask layer; G: forming a second intrinsic amorphous silicon layer on the second main surface of the semiconductor substrate; and H: forming an N-type oxygen-doped (Continued)

microcrystalline silicon layer on the second intrinsic amorphous silicon layer.

20 Claims, 7 Drawing Sheets

(56) References Cited

U.S. PATENT DOCUMENTS

| | | | | |
|---|---|---|---|---|
| 2012/0260983 | A1* | 10/2012 | Pruneri | H01G 9/2031 |
| | | | | 136/256 |
| 2012/0305060 | A1* | 12/2012 | Fu | H10F 71/121 |
| | | | | 136/258 |
| 2015/0364626 | A1* | 12/2015 | Lim | H10K 30/82 |
| | | | | 136/256 |
| 2020/0075789 | A1* | 3/2020 | Löper | H10F 71/103 |
| 2024/0194812 | A1* | 6/2024 | Wang | H10F 71/138 |

FOREIGN PATENT DOCUMENTS

| | | |
|---|---|---|
| CN | 109494261 A | 3/2019 |
| CN | 110085699 A | 8/2019 |
| CN | 110233180 A | 9/2019 |
| CN | 110911505 A | 3/2020 |
| CN | 111029438 A | 4/2020 |
| CN | 112687764 A | 4/2021 |
| CN | 112864284 A | 5/2021 |
| CN | 113488547 A | 10/2021 |
| CN | 114628538 A | 6/2022 |
| CN | 114823936 A | 7/2022 |

OTHER PUBLICATIONS

Muhammad Quddamah Khokhar, et al., High-efficiency hybrid solar cell with a nano-crystalline silicon oxide layer as an electron-selective contact, Energy Conversion and Management, 2022, pp. 1-11, vol. 252 No. 115033.

G. Limodio, et al., Front and rear contact Si solar cells combining high and low thermal budget Si passivating contacts, Solar Energy Materials and Solar Cells, 2019, pp. 28-35, vol. 194.

Dibyendu Kumar Ghosh, et al., Fundamentals, present status and future perspective of TOPCon solar cells: A comprehensive review, Surfaces and Interfaces, 2022, pp. 1-38, vol. 30 No. 101917.

M. Khelil, et al., Growth of crystalline silicon by a seed layer approach using plasma enhanced chemical vapor deposition, Physica B: Physics of Condensed Matter, 2021, pp. 1-9, vol. 609 No. 412817.

* cited by examiner

HETEROJUNCTION SOLAR CELL AND MANUFACTURING METHOD THEREOF

CROSS REFERENCE TO THE RELATED APPLICATIONS

This application is based upon and claims priority to Chinese Patent Application No. 202211066022.9, filed on Sep. 1, 2022; and Chinese Patent Application No. 202211209200.9, filed on Sep. 30, 2022, the entire contents of which are incorporated herein by reference.

TECHNICAL FIELD

The present disclosure belongs to the technical field of solar cells, and in particular to a heterojunction solar cell and a manufacturing method thereof.

BACKGROUND

With the constant development of science and technology, solar cells have been widely applied to people's daily lives and industries. In recent years, with continuous progress made in production, the solar cell production cost has increasingly lowered, and the conversion efficiency has improved. Thus, power generation of solar cells is more extensive and has become an important energy source for electric power supply.

As an efficient cell technology, the silicon-based heterojunction solar cell has the advantages of a monocrystalline silicon solar cell and an amorphous silicon solar cell, such as a high conversion efficiency and a desirable high-temperature characteristic, which has great potential in the markets.

At present, a passivation layer and a doped layer on the front and back surfaces of the silicon-based heterojunction solar cell are deposited with a plate-type plasma-enhanced chemical vapor deposition (PECVD) device at a temperature of less than 220° C. In order to reduce cross contamination between doping elements, a silicon wafer is generally obtained by sequentially depositing an intrinsic amorphous silicon layer on the back surface, an intrinsic amorphous silicon layer and an N-type doped amorphous silicon layer on the front surface, and a P-type doped amorphous silicon layer on the back surface. There are three sets of the plate-type PECVD coating devices that go in and out of a vacuum chamber for three times. This causes a high equipment cost and seriously hinders development of heterojunction solar cell technology.

SUMMARY

An objective of the present disclosure is to provide a manufacturing method of a heterojunction solar cell. The manufacturing method omits two sets of plate-type PECVD devices to greatly lower an equipment investment cost.

Another objective of the present disclosure is to provide a heterojunction solar cell, to prevent a power loss caused by carrier transmission on a back surface of the cell, and improve an efficiency of the cell.

Objectives of the present disclosure are achieved by the following technical solutions.

A manufacturing method of a heterojunction solar cell includes the following steps:
A: forming a tunnel oxide layer on a first main surface of a semiconductor substrate;
B: forming a first intrinsic polysilicon layer on the tunnel oxide layer;
C: forming the first intrinsic polysilicon layer into a P-type polysilicon layer by diffusion annealing;
D: removing a borosilicate glass (BSG) layer formed by the diffusion annealing;
E: forming a mask layer on the P-type polysilicon layer;
F: performing texturing and cleaning on a second main surface of the semiconductor substrate, and removing the mask layer;
G: forming a second intrinsic amorphous silicon layer on the second main surface of the semiconductor substrate; and
H: forming an N-type oxygen-doped microcrystalline silicon layer on the second intrinsic amorphous silicon layer.

A heterojunction solar cell includes a first electrode, a first conductive film layer, an N-type semiconductor film layer, an intrinsic film layer, the semiconductor substrate, the tunnel oxide layer, a P-type carbon-doped semiconductor film layer, a highly concentrated P-type doped semiconductor film layer, a second conductive film layer, and a second electrode that are sequentially stacked from a light-facing surface to a backlight surface, where the first conductive film layer completely covers the N-type semiconductor film layer; the first electrode is electrically connected to the N-type semiconductor film layer through the first conductive film layer; the second conductive film layer completely covers the highly concentrated P-type doped semiconductor film layer; and the second electrode is electrically connected to the highly concentrated P-type doped semiconductor film layer through the second conductive film layer.

The present disclosure has the following advantages over the prior art:
(1) With the tunnel oxide layer and the P-type polysilicon layer instead of an intrinsic amorphous silicon layer, a P-type doped amorphous layer and a part of an oxygen-doped microcrystalline layer, the carrier mobility of the cell is significantly improved. Therefore, the present disclosure can greatly prevent a power loss caused by carrier transmission on a back surface of the cell, and improves an efficiency of the cell.
(2) With the tunnel oxide layer and the P-type polysilicon layer instead of an intrinsic amorphous silicon layer and a P-type doped amorphous/microcrystalline layer, the cell has a better weather resistance and a better high-temperature resistance in subsequent processes. Meanwhile, two sets of plate-type PECVD devices are omitted. This improves a quality of the cell and greatly reduces an equipment investment cost.
(3) The P-type polysilicon laminated layer (namely the P-type carbon-doped polysilicon layer and the highly concentrated P-type doped polysilicon layer) is used. With the P-type carbon-doped polysilicon layer, the present disclosure increases an energy band gap, reduces absorption of infrared light, and achieves a higher short-circuit current. With the highly concentrated P-type doped polysilicon layer, the present disclosure increases a doping concentration, achieves a better conductivity, and improves carrier transmission, thereby improving a fill factor and a conversion efficiency of the cell.

DETAILED DESCRIPTION OF THE EMBODIMENTS

Figure 1:
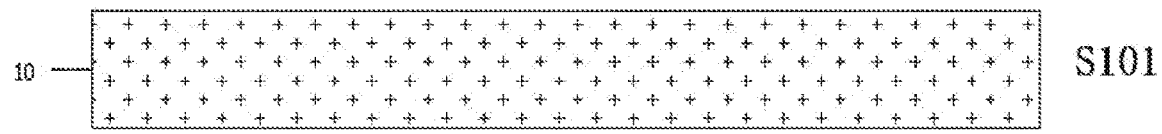
FIG. 1 illustrates an N-type monocrystalline silicon wafer polished and cleaned in a manufacturing method according to an embodiment of the present disclosure.

A manufacturing method of a heterojunction solar cell includes the following steps:

A: A tunnel oxide layer is formed on a first main surface of a semiconductor substrate.

B: A first intrinsic polysilicon layer is formed on the tunnel oxide layer.

C: The first intrinsic polysilicon layer is formed into a P-type polysilicon layer by diffusion annealing.

D: A BSG layer formed by the diffusion annealing is removed.

E: A mask layer is formed on the P-type polysilicon layer.

F: Texturing and cleaning are performed on a second main surface of the semiconductor substrate, and the mask layer is removed.

G: A second intrinsic amorphous silicon layer is formed on the second main surface of the semiconductor substrate.

H: An N-type oxygen-doped microcrystalline silicon layer is formed on the second intrinsic amorphous silicon layer.

The manufacturing method further includes the following steps:

I: A first conductive film layer is formed on the P-type polysilicon layer, and a second conductive film layer is formed on the N-type oxygen-doped microcrystalline silicon layer.

J: A first metal electrode is formed on the first conductive film layer, and a second metal electrode is formed on the second conductive film layer.

Before Step A, polishing and cleaning are further performed. Specifically, the semiconductor substrate is polished with an alkaline solution having a temperature of 65-90° C. and containing 3-12% of potassium hydroxide or sodium hydroxide by mass percentage concentration, and then cleaned with a weak alkaline solution and an acidic solution.

Step A specifically includes: The tunnel oxide layer is formed on the first main surface of the semiconductor substrate by dry oxidation or wet oxidation. The dry oxidation is to use thermal oxidation or CVD or plasma-assisted oxidation. The wet oxidation is to use nitric acid oxidation or ozone oxidation or hydrogen peroxide oxidation.

Step C specifically includes: Boron doping is performed on the first intrinsic polysilicon layer. Boron trichloride $BCl_3$ or boron tribromide $BBr_3$ is used as a doping source. High-purity oxygen with a purity of greater than 99.9% is used as an oxygen source. The diffusion annealing is performed for 90-300 min at 800-1,100° C., thereby forming the P-type polysilicon layer and the BSG layer.

Step E specifically includes. At least one of silicon nitride, silicon oxynitride and silicon oxide is deposited on the P-type polysilicon layer by PECVD or high-temperature CVD to form the mask layer.

The mask layer has a thickness of 30-150 nm.

Step F specifically includes: A pyramid texture is formed on the second main surface of the semiconductor substrate through the texturing and the cleaning, and the mask layer is removed with a fluorine-containing acidic solution.

The tunnel oxide layer 11 has a thickness of 1-2.5 nm. The P-type polysilicon layer has a thickness of 30-250 nm, and a sheet resistance of 30-300 Ω/square. The second intrinsic amorphous silicon layer is a hydrogenated intrinsic amorphous silicon layer, with a thickness of 5-12 nm. The N-type oxygen-doped microcrystalline silicon layer has a thickness of 5-25 nm. The N-type oxygen-doped microcrystalline silicon layer is an oxygen-containing N-type microcrystalline layer.

Step H specifically includes: The N-type oxygen-doped microcrystalline silicon layer laminated by at least one oxygen-containing microcrystalline layer and at least one oxygen-free microcrystalline layer is formed by PECVD or hot-wire CVD. In a preferred solution, a first oxygen-free microcrystalline layer, the oxygen-containing microcrystalline layer, and a second oxygen-free microcrystalline layer are sequentially deposited on the second intrinsic amorphous silicon layer.

In Step H, each film layer of the N-type oxygen-doped microcrystalline silicon layer is deposited by stepwise increasing a ratio of an N-type dopant gas to silane.

The present disclosure will be described in detail below with reference to the drawings and embodiments.

Embodiment 1

S101: N-type monocrystalline silicon wafer 10 polished and cleaned is provided, as shown in FIG. 1.

A surface of the N-type monocrystalline silicon wafer 10 is polished with an alkaline solution having a temperature of 65-90° C. and containing 3-10% of potassium hydroxide or sodium hydroxide by mass percentage concentration. Then, the surface of the silicon wafer 10 is cleaned with a weak alkaline solution and an acidic solution. The silicon wafer 10 is a czochralski monocrystalline silicon wafer or an ingot-cast monocrystalline silicon wafer. A pyramid texture has a size of 1-10 μm.

Figure 2:
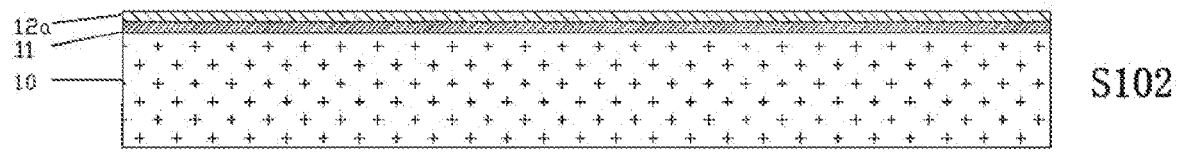
FIG. 2 is a schematic structural view illustrating that a tunnel oxide layer and an intrinsic polysilicon layer are formed on a back surface of a silicon wafer in a manufacturing method according to an embodiment of the present disclosure.

S102: Tunnel oxide layer 11 and first intrinsic polysilicon layer 12a are sequentially formed on a back surface of the silicon wafer 10, as shown in FIG. 2.

The tunnel oxide layer 11 is formed by dry oxidation or wet oxidation. The dry oxidation is to use thermal oxidation or CVD or plasma-assisted oxidation. The wet oxidation is to use nitric acid oxidation or ozone oxidation or hydrogen peroxide oxidation. The tunnel oxide layer 11 has a thickness of 1-2.5 nm. The first intrinsic polysilicon layer 12a has a thickness of 30-250 nm.

Figure 3:
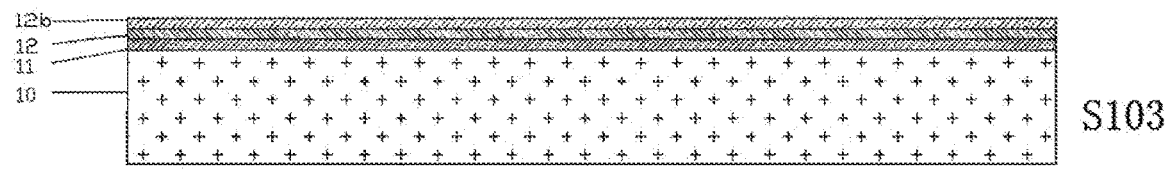
FIG. 3 is a schematic structural view illustrating that upon high-temperature diffusion on a silicon wafer, an intrinsic polysilicon layer on a back surface of the silicon wafer is converted into a P-type doped polysilicon layer and a BSG layer is formed in a manufacturing method according to an embodiment of the present disclosure.

S103: The first intrinsic polysilicon layer 12a is doped with boron by diffusion annealing to form P-type polysilicon layer 12, as shown in FIG. 3.

In diffusion, boron trichloride $BCl_3$ or boron tribromide $BBr_3$ is used as a doping source. High-purity oxygen with a purity of greater than 99.9% is used as an oxygen source. The diffusion annealing is performed for 90-300 min at 800-1,100° C. Upon the diffusion annealing, BSG layer 12b is formed on the back surface of the silicon wafer. The P-type polysilicon layer has a thickness of 30-250 nm, and a sheet resistance of 30-300 Ω/square.

Figure 4:
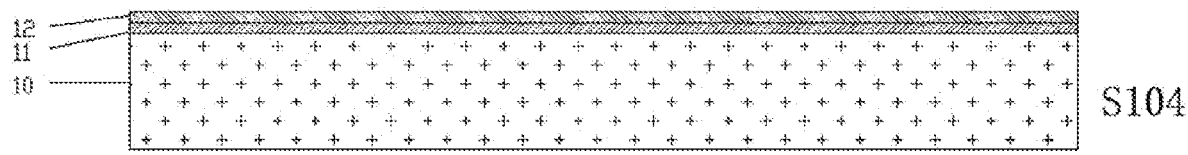
FIG. 4 is a schematic structural view after a BSG layer is removed on a back surface of a silicon wafer in a manufacturing method according to an embodiment of the present disclosure.

S104: The BSG layer 12b on the surface of the silicon wafer 10 is removed with an acidic solution at least containing fluoride ions (a fluorine-containing acidic solution), as shown in FIG. 4.

Figure 5:
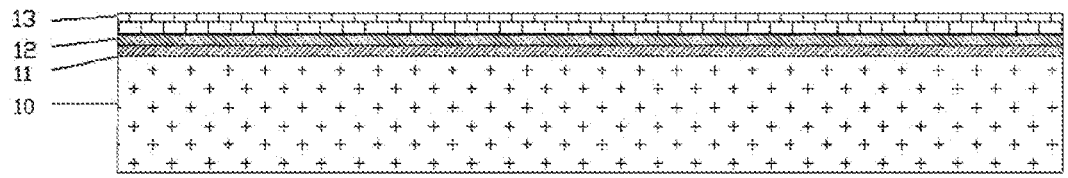
FIG. 5 is a schematic structural view illustrating that a mask layer is formed on a back surface of a silicon wafer by CVD in a manufacturing method according to an embodiment of the present disclosure.

S105: Mask layer 13 is deposited on the back surface of the silicon wafer 10 by PECVD or high-temperature CVD, as shown in FIG. 5.

The mask layer 13 is at least one of silicon nitride, silicon oxynitride, and silicon oxide. The mask layer 13 has a thickness of 30-150 nm.

Figure 6:
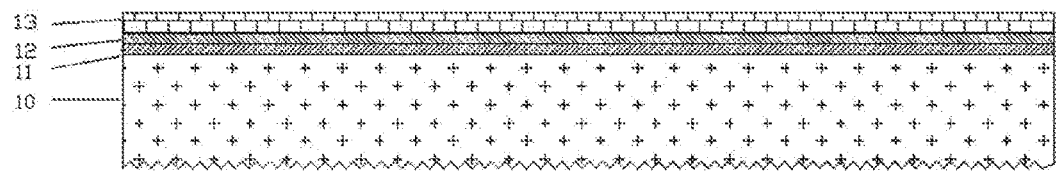
FIG. 6 is a schematic structural view illustrating that a pyramid texture is formed on a front surface of a silicon wafer through texturing and cleaning in a manufacturing method according to an embodiment of the present disclosure.
Figure 7:
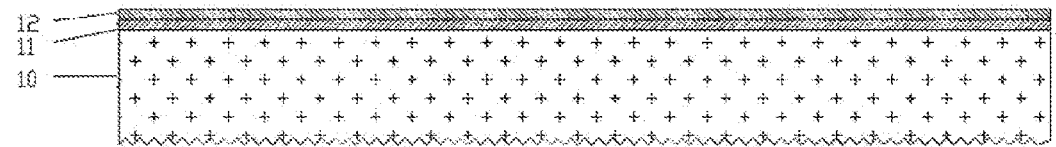
FIG. 7 is a schematic structural view illustrating that a mask layer on a back surface of a silicon wafer is removed through a fluorine-containing acidic solution in a manufacturing method according to an embodiment of the present disclosure.

S106: As shown in FIG. 6, the pyramid texture is formed on a front surface of the silicon wafer 10 through texturing and cleaning in S106a. As shown in FIG. 7, in S106b, the mask layer 13 is removed with the acidic solution at least containing the fluoride ions.

Figure 8:
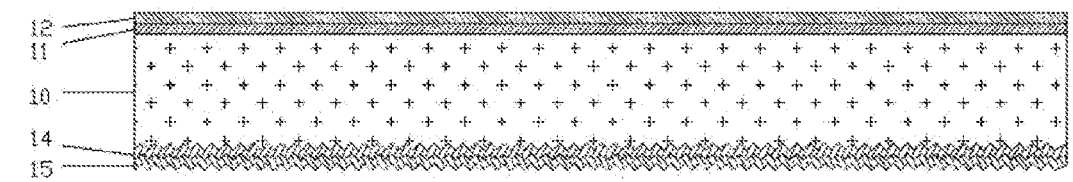
FIG. 8 is a schematic structural view illustrating that an intrinsic amorphous silicon layer and an N-type oxygen-doped microcrystalline silicon layer are sequentially deposited on a front surface of a silicon wafer by PECVD or hot-wire CVD in a manufacturing method according to an embodiment of the present disclosure.

S107: Hydrogenated intrinsic amorphous silicon layer 14 and N-type oxygen-doped microcrystalline silicon layer 15 are sequentially deposited on the front surface of the silicon wafer 10 by PECVD, as shown in FIG. 8. The hydrogenated intrinsic amorphous silicon layer 14 has a thickness of 3-12 nm, and the N-type oxygen-doped microcrystalline silicon layer 15 has a thickness of 5-25 nm.

Figure 18:
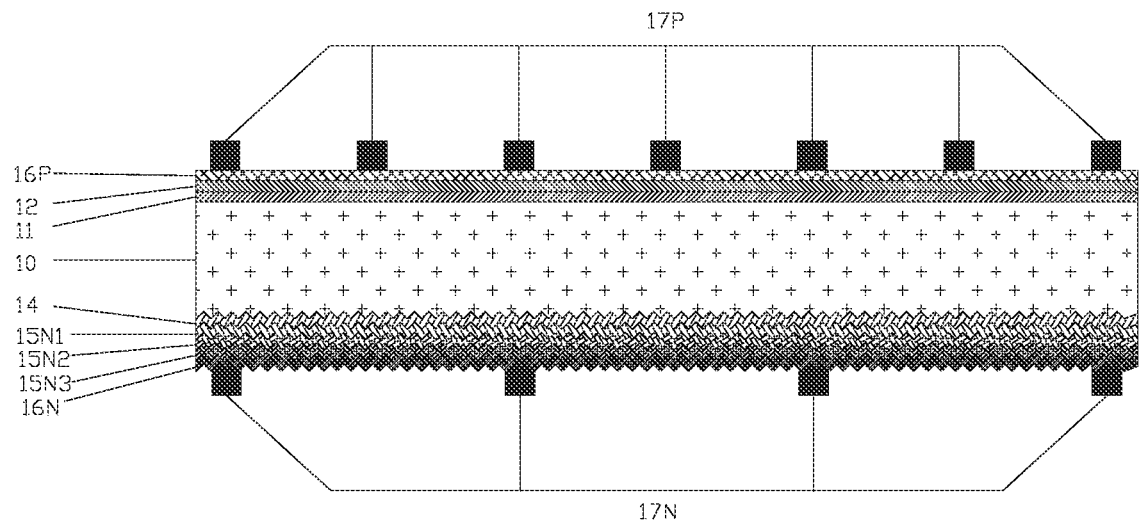
FIG. 18 is a schematic structural view of a preferred solution in a manufacturing method according to Embodiment 1 of the present disclosure.

In a preferred solution, after the hydrogenated intrinsic amorphous silicon layer 14 is deposited on the front surface of the silicon wafer 10, first oxygen-free microcrystalline layer 15N1, oxygen-containing microcrystalline layer 15N2, and second oxygen-free microcrystalline layer 15N3 as shown in FIG. 18 are sequentially deposited on the hydrogenated intrinsic amorphous silicon layer 14 by PECVD in a manner of stepwise increasing a doping concentration. The first oxygen-free microcrystalline layer 15N1, the oxygen-containing microcrystalline layer 15N2, and the second oxygen-free microcrystalline layer 15N3 are deposited with a mixed gas of phosphorane and hydrogen (hereinafter referred to as a "phosphorane-hydrogen mixed gas", in which there is 2% of the phosphorane by volume). In deposition of each film layer, a proportion of the phosphorane-hydrogen mixed gas to silane is stepwise increased from 1:1 to 10:1.

Figure 9:
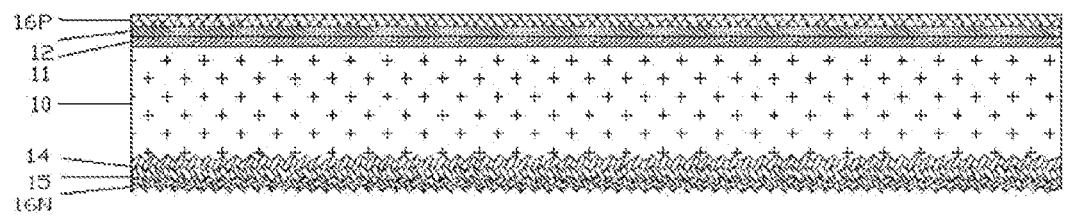
FIG. 9 is a schematic structural view illustrating that with physical vapor deposition (PVD), a second conductive film layer is deposited on a front surface of a silicon wafer, and a first conductive film layer is deposited on a back surface of the silicon wafer in a manufacturing method according to Embodiment 1 of the present disclosure.

S108a: With PVD or reactive plasma deposition (RPD), second conductive film layer 16N is deposited on the front surface of the silicon wafer, and first conductive film layer 16P is deposited on the back surface of the silicon wafer 10, as shown in FIG. 9.

The first conductive film layer and the second conductive film layer are any one or more of an indium tin oxide (ITO) film layer, a tungsten-doped indium oxide (IWO) film layer, an aluminum-doped zinc oxide (AZO) film layer, a zinc-doped indium oxide (IZO) film layer, a gallium-doped zinc oxide (GZO) film layer, a titanium-doped indium oxide (ITiO) film layer, and an indium gallium zinc oxide (IGZO) film layer. The second conductive film layer has a thickness of 70-110 nm, and the first conductive film layer has a thickness of 20-80 nm.

Figure 13:
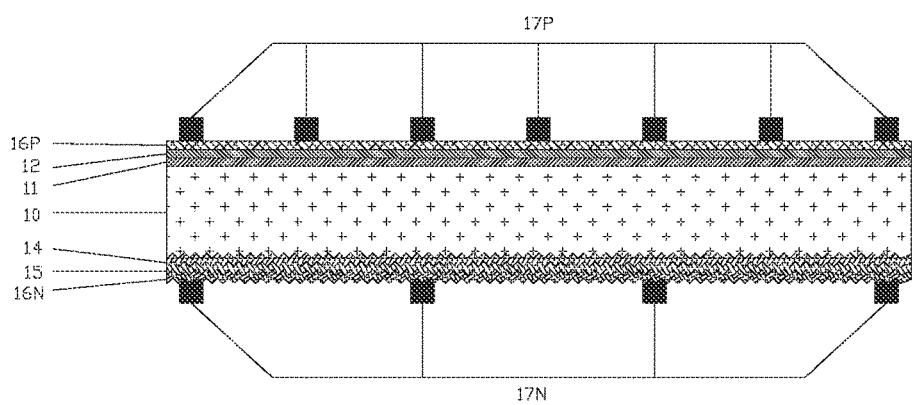
FIG. 13 is a schematic structural view illustrating that a silver paste metal electrode is formed on each of a front surface and a back surface of a silicon wafer by silver paste printing in a manufacturing method according to Embodiment 1 of the present disclosure.

S109a: Silver paste metal electrode 17N/17P is formed on each of the front surface and the back surface of the silicon wafer 10 by silver paste printing, as shown in FIG. 13.

Figure 10:
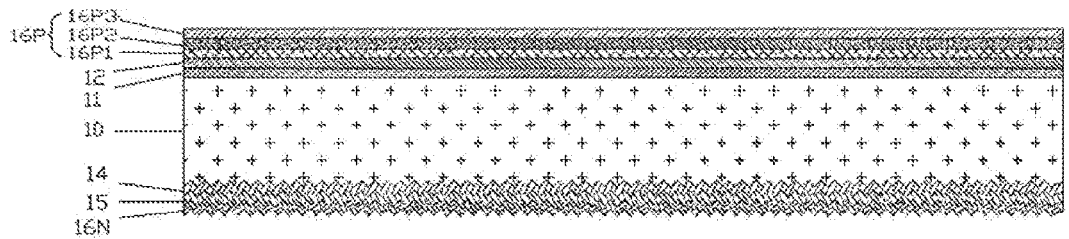
FIG. 10 is a schematic structural view illustrating that through PVD, a second conductive film layer is deposited on a front surface of a silicon wafer, and a first conductive film layer is deposited on a back surface of the silicon wafer in a manufacturing method according to Embodiment 2 of the present disclosure.

Embodiment 2 differs from Embodiment 1 in:

S108b: With PVD or RPD, second conductive film layer 16N is deposited on the front surface of the silicon wafer 10, and first conductive film layer 16P is deposited on the back surface of the silicon wafer 10, as shown in FIG. 10. The second conductive film layer 16N includes an ITO component, with a thickness of 70-110 nm. The first conductive film layer 16P is a composite layer of transparent conductive film layer 16P1, metal conductive layer 16P2, and protective layer 16P3. The transparent conductive film layer 16P1 is either an ITO film layer or an IWO film layer, with a thickness of 20-100 nm. The metal conductive layer 16P2 is made of metal copper, with a thickness of 100-500 nm. The protective layer 16P3 is made of a metal nickel-chromium alloy, with a thickness of 30-100 nm.

Figure 14:
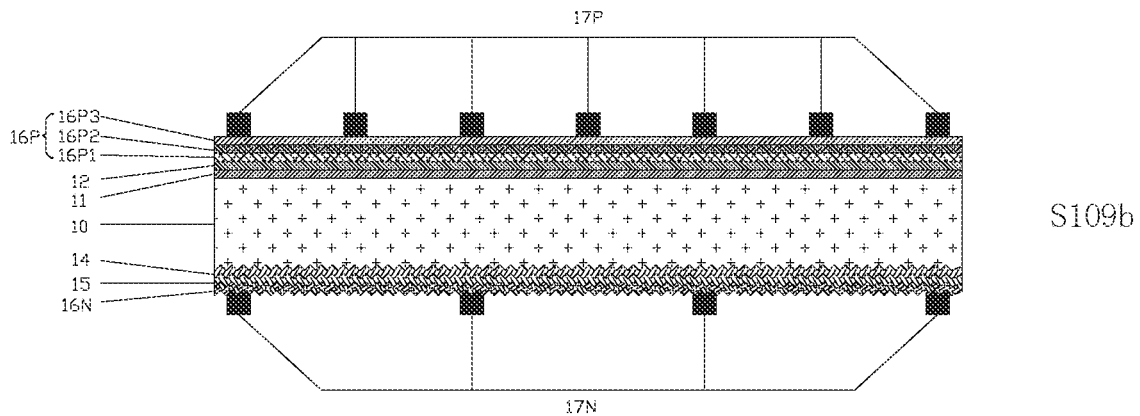
FIG. 14 is a schematic structural view illustrating that a silver paste metal electrode is formed on each of a front surface and a back surface of a silicon wafer by silver paste printing in a manufacturing method according to Embodiment 2 of the present disclosure.

S109b: With silver paste printing, silver paste metal electrode 17N is formed on the front surface of the silicon wafer 10, and silver paste metal electrode 17P is formed on the back surface of the silicon wafer 10, as shown in FIG. 14.

Embodiment 3 differs from Embodiment 1 in: A metal grid line is formed by electroplating.

Figure 11:
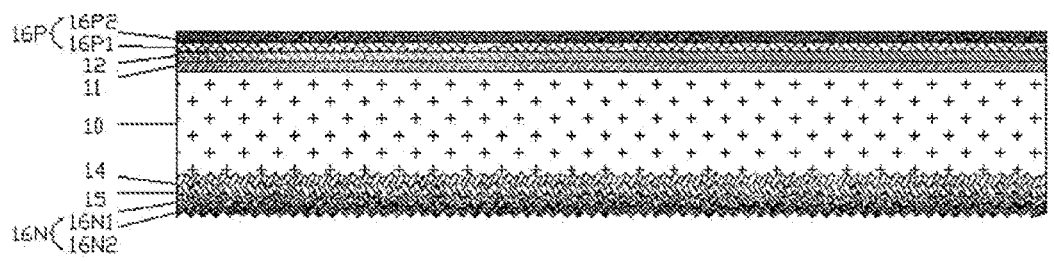
FIG. 11 is a schematic structural view illustrating that a second conductive film layer and a first conductive film layer are respectively deposited on a front surface and a back surface of a silicon wafer by PVD in a manufacturing method according to Embodiment 3 of the present disclosure, the first conductive film layer and the second conductive film layer being a composite layer of a transparent conductive film layer and a copper seed layer.
Figure 12:
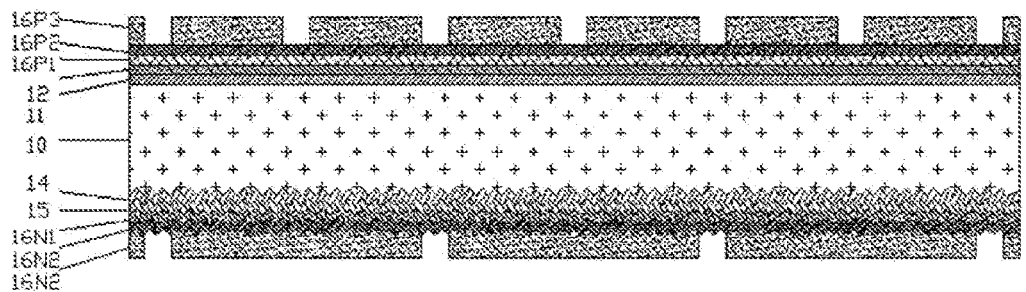
FIG. 12 is a schematic structural view illustrating that an electroplated grid line mask layer is formed on each of a front surface and a back surface of a silicon wafer in a manufacturing method according to Embodiment 3 of the present disclosure.

S108: With PVD or RPD, second conductive film layer 16N is deposited on the front surface of the silicon wafer 10, and first conductive film layer 16P is deposited on the back surface of the silicon wafer 10 in S108c1, as shown in FIG. 11. The second conductive film layer 16N is a composite layer of transparent conductive film layer 16N1 and copper seed layer 16N2. The first conductive film layer 16P is composite layer of transparent conductive film layer 16P1 and copper seed layer 16P2. The transparent conductive film layer 16N1/16P1 is either an ITO film layer or an IWO film layer, with a thickness of 20-100 nm. The copper seed layer 16N2/16P2 is deposited upon formation of the transparent conductive film layer 16N1/16P1, with a thickness of 50-150 nm. As shown in FIG. 12, in S108c2, with ink-jet printing or a manner of printing and exposing an ink and then performing exposure and development, electroplated grid line mask layer 16N3 is formed on the front surface of the silicon wafer 10, and electroplated grid line mask layer 16P3 is formed on the back surface of the silicon wafer 10. The electroplated grid line mask layer 16N3/16P3 has a thickness of 5-30 μm. As shown in FIG. 11 and FIG. 12, the transparent conductive film layer 16N1, the copper seed layer 16N2 and the electroplated grid line mask layer 16N3 are sequentially formed on the front surface of the silicon wafer 10, and the transparent conductive film layer 16P1, the copper seed layer 16P2 and the electroplated grid line mask layer 16P3 are sequentially formed on the back surface of the silicon wafer 10.

Figure 15:
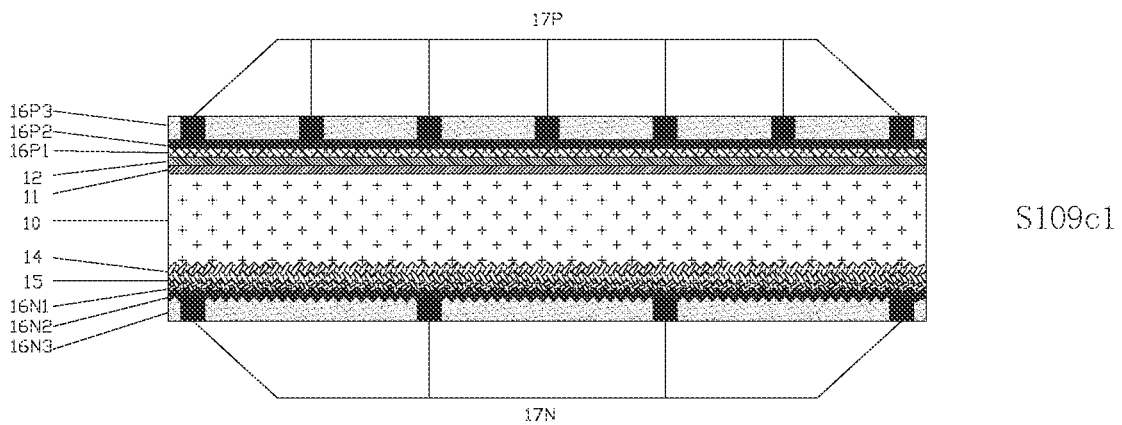
FIG. 15 is a schematic structural view illustrating that a copper grid line electrode is formed on each of a front surface and a back surface of a silicon wafer by electroplating in a manufacturing method according to Embodiment 3 of the present disclosure.
Figure 16:
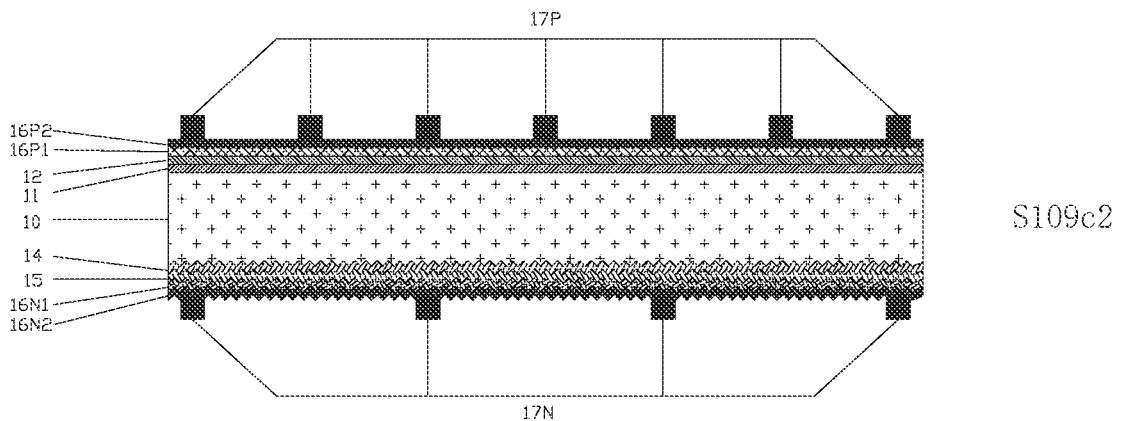
FIG. 16 is a schematic structural view illustrating that an electroplated grid line mask layer on each of a front surface and a back surface of a silicon wafer is removed with an alkaline etching solution in a manufacturing method according to Embodiment 3 of the present disclosure.
Figure 17:
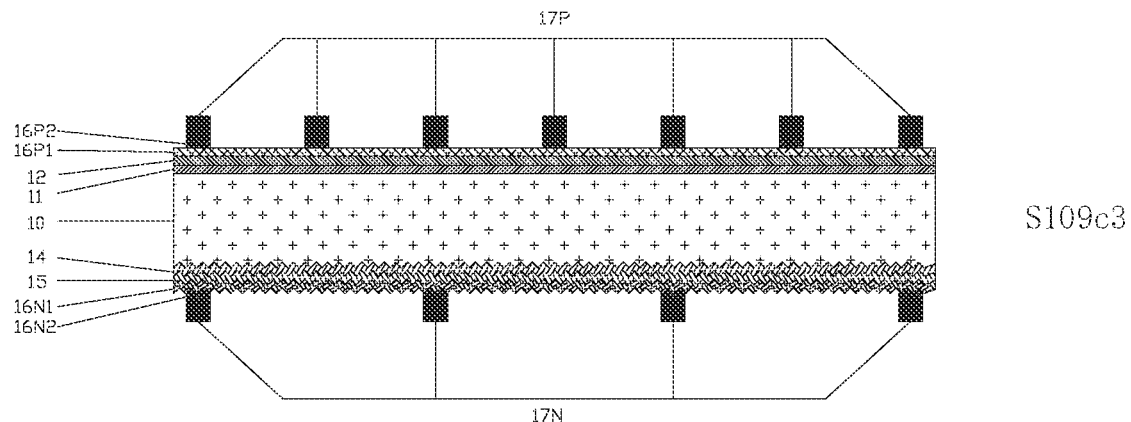
FIG. 17 is a schematic structural view illustrating that a copper seed layer beyond an electroplated grid line on each of a front surface and a back surface of a silicon wafer is removed with an alkaline etching solution or an acidic etching solution in a manufacturing method according to Embodiment 3 of the present disclosure.

S109: With electroplating, copper grid line electrode 17N is formed on the front surface of the silicon wafer 10, and copper grid line electrode 17P is formed on the back surface of the silicon wafer 10 in S109c1, as shown in FIG. 15. The copper grid line electrode 17N/17P is a composite layer of metal copper and metal tin. The metal copper has a thickness of 5-20 μm, and the metal tin has a thickness of 1-6 μm. As shown in FIG. 16, through an alkaline etching solution, such as a sodium hydroxide and potassium hydroxide solution with a mass percentage concentration of 1-10%, the electroplated grid line mask layer 16N3/16P3 is removed in S109c2. As shown in FIG. 17, through a metal copper etching solution mixed by sulfuric acid with a mass percentage concentration of 1-5% and hydrogen peroxide with a mass percentage concentration of 5-15%, the copper seed layer 16N2/16P2 beyond the copper grid line electrode 17N/17P on the front and back surfaces of the silicon wafer is removed in S109c3.

According to the above embodiment of the present disclosure, the N-type oxygen-doped microcrystalline silicon layer is used by a window layer on the front surface. Therefore, a wider optical band gap and a less optical loss are achieved. With comparison on a light-facing layer of the front surface, the heterojunction microcrystalline solution with a same thickness has more excellent response to PVD sputtering, and can keep a higher passivation level and a higher final conversion efficiency.

The above are merely preferred examples of the present disclosure, and not intended to limit the present disclosure. Any modifications, equivalent replacements, and improvements made within the spirit and principle of the present disclosure should fall within the protection scope of the present disclosure.

A heterojunction solar cell includes a first electrode, a first conductive film layer, an N-type semiconductor film layer, an intrinsic film layer, a semiconductor substrate, a tunnel oxide layer, a P-type carbon-doped semiconductor film layer, a highly concentrated P-type doped semiconductor film layer, a second conductive film layer, and a second electrode that are sequentially stacked from a light-facing surface to a backlight surface. The first conductive film layer completely covers the N-type semiconductor film layer. The first electrode is electrically connected to the N-type semiconductor film layer through the first conductive film layer. The second conductive film layer completely covers the highly concentrated P-type doped semiconductor film layer. The second electrode is electrically connected to the highly concentrated P-type doped semiconductor film layer through the second conductive film layer.

The semiconductor substrate is a monocrystalline silicon wafer. A pyramid texture is provided on the light-facing surface of the semiconductor substrate. The pyramid texture has a size of 1-10 μm.

The intrinsic film layer is an intrinsic amorphous silicon layer, and has a thickness of 3-12 nm. The N-type semiconductor film layer has a thickness of 9-20 nm.

The P-type carbon-doped semiconductor film layer is a P-type carbon-doped polysilicon layer. The highly concentrated P-type doped semiconductor film layer is a highly concentrated P-type doped polysilicon layer.

The tunnel oxide layer has a thickness of 1-3 nm. The P-type carbon-doped polysilicon layer and the highly concentrated P-type doped polysilicon layer have a total thickness of 100-250 nm, and a sheet resistance of 30-150 Ω/square. A proportion of the P-type carbon-doped polysilicon layer to the highly concentrated P-type doped semiconductor film layer in thickness is (1-3):5. In a preferred solution, the P-type carbon-doped polysilicon layer has a thickness of 30-100 nm, and a sheet resistance of 70-150 K/square. The highly concentrated P-type doped semiconductor film layer has a thickness of 50-150 nm, and a sheet resistance of 30-70 Ω/square.

The N-type semiconductor film layer has a phosphorus doping concentration of $10^{19}$-$10^{21}$ cm$^{-3}$. The P-type carbon-doped polysilicon layer has a boron doping concentration of $10^{18}$-$10^{20}$ cm$^{-3}$, and a carbon doping concentration of $10^{18}$-$10^{20}$ cm$^{-3}$. The highly concentrated P-type doped semiconductor film layer has a boron doping concentration of $10^{19}$-$10^{21}$ cm$^{-3}$.

The first conductive film layer and/or the second conductive film layer is a transparent conductive film layer or a composite laminated layer of the transparent conductive film layer and a metal film layer.

The transparent conductive film layer is one or more of an ITO film layer, an IWO film layer, an IGZO film layer, an AZO film layer, an IZO film layer, a GZO film layer, and an ITiO film layer. The metal film layer is made of one or more of copper (Cu), silver (Ag), an aluminum (Al), a nickel alloy, gold (Au), ITO, AZO, and GZO.

Figure 24:
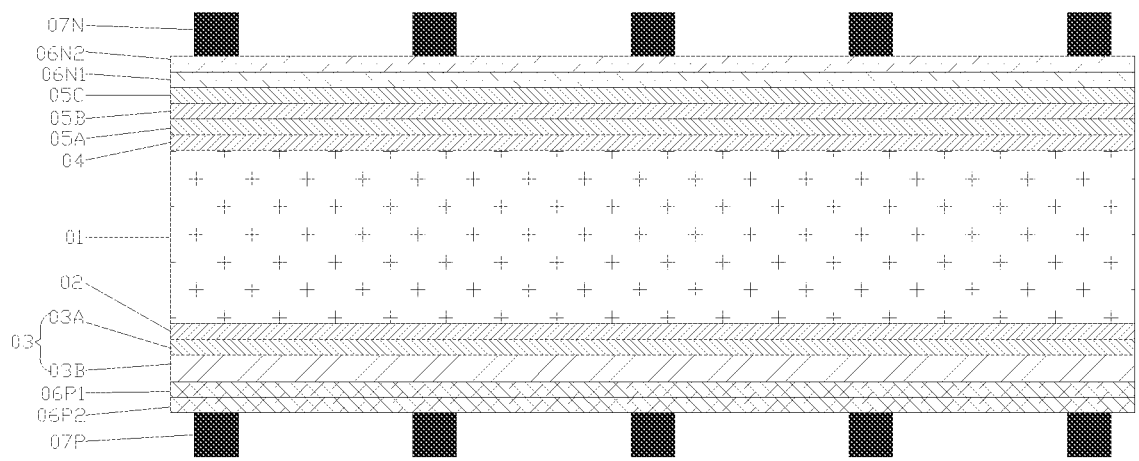
FIG. 24 is a schematic structural view of a heterojunction solar cell according to a solution of the present disclosure.
Figure 25:
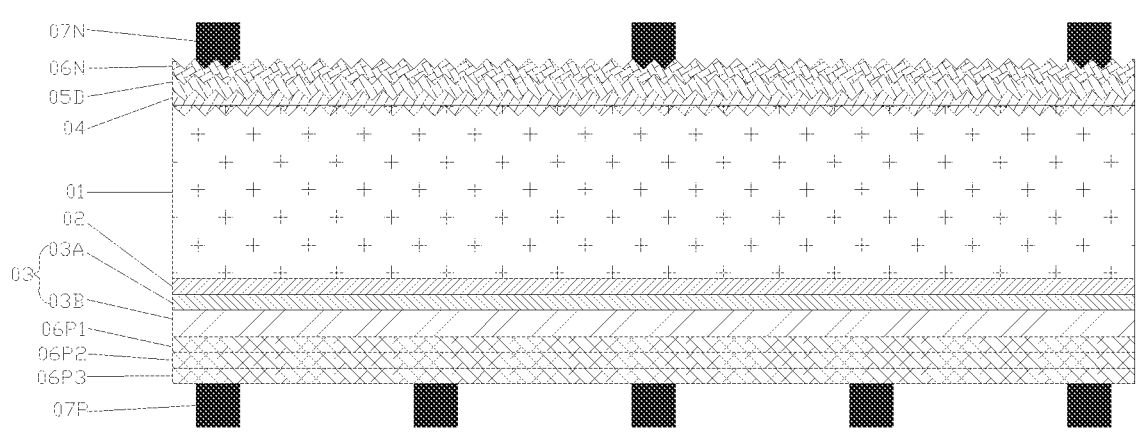
FIG. 25 is a schematic structural view of a heterojunction solar cell according to a preferred solution of the present disclosure.

The first conductive film layer has a thickness of 50-70 nm. The second conductive film layer is the transparent conductive film layer, with a thickness of 30-150 nm. In a solution, as shown in FIG. 24, the first conductive film layer 06N is a composite layer of transparent conductive film layer 06N1 and metal conductive layer 06N2. The second conductive film layer 06P is a composite layer of transparent conductive film layer 06P1 and metal conductive layer 06P2. The transparent conductive film layer 06N1/06P1 is either an ITO film layer or an IWO film layer, with a thickness of 20-100 nm. The metal conductive layer 06N2/06P2 is a copper seed layer, with a thickness of 50-150 nm. In a preferred solution, as shown in FIG. 25, the first conductive film layer 06N is a transparent conductive film, and is made of ITO, with a thickness of 70-110 nm. The second conductive film layer 06P is a composite layer of transparent conductive film layer 06P1, metal conductive layer 06P2, and protective layer 06P3. The transparent conductive film layer 06P1 is either an ITO film layer or an IWO film layer, with a thickness of 20-100 nm. The metal conductive layer 06P2 is made of metal copper, with a thickness of 100-500 nm. The protective layer 06P3 is made of a metal nickel-chromium alloy, with a thickness of 30-100 nm.

The N-type semiconductor film layer is an N-type microcrystalline laminated layer. The N-type microcrystalline laminated layer includes at least one oxygen-containing microcrystalline layer and at least one oxygen-free microcrystalline layer.

The N-type microcrystalline laminated layer includes the oxygen-free microcrystalline layer, the oxygen-containing microcrystalline layer, and an oxygen-free incubation layer that are sequentially stacked from the light-facing surface to the backlight surface.

Each film layer of the N-type microcrystalline laminated layer is deposited by stepwise increasing a ratio of an N-type dopant gas to silane.

The first conductive film layer has a refractive index of 1.75-1.9, and the N-type semiconductor film layer has a refractive index of 2.5-2.9.

Embodiment 4

Figure 19:
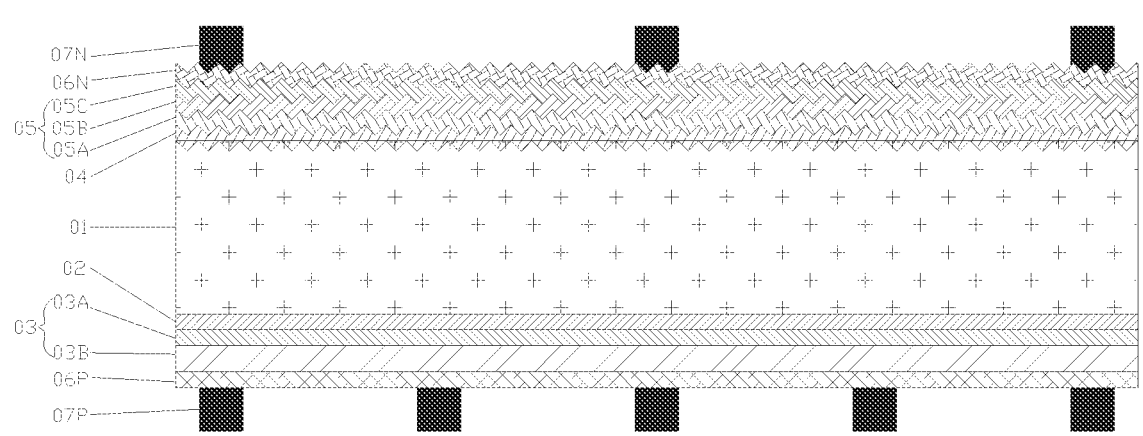
FIG. 19 is a schematic structural view of a heterojunction solar cell according to Embodiment 4 of the present disclosure.

As shown in FIG. 19, a heterojunction solar cell includes first electrode 07N, first conductive film layer 06N, N-type semiconductor film layer 05, intrinsic film layer 04, semiconductor substrate 01, tunnel oxide layer 02, a P-type carbon-doped semiconductor film layer, a highly concentrated P-type doped semiconductor film layer, second conductive film layer 06P, and second electrode 07P that are sequentially stacked from a light-facing surface to a backlight surface. The first conductive film layer 06N completely covers the N-type semiconductor film layer. The first electrode 07N is electrically connected to the N-type semiconductor film layer 05 through the first conductive film layer 06N. The second conductive film layer 06P completely covers the highly concentrated P-type doped semiconductor film layer. The second electrode 07P is electrically connected to the highly concentrated P-type doped semiconductor film layer through the second conductive film layer 06P. The P-type carbon-doped semiconductor film layer and the highly concentrated P-type doped semiconductor film layer are jointly formed into P-type semiconductor film layer 3.

The semiconductor substrate 01 is an N-type monocrystalline silicon wafer. A pyramid texture is provided on the light-facing surface of the semiconductor substrate 01. The pyramid texture has a size of 5 μm.

The intrinsic film layer 04 is an intrinsic amorphous silicon layer, and has a thickness of 6 nm. The N-type semiconductor film layer 05 has a thickness of 13 nm.

The P-type carbon-doped semiconductor film layer is P-type carbon-doped polysilicon layer 03A. The highly concentrated P-type doped semiconductor film layer is highly concentrated P-type doped polysilicon layer 03B.

The tunnel oxide layer 02 has a thickness of 2 nm. The P-type carbon-doped polysilicon layer 03A has a thickness of 60 nm, and a sheet resistance of 100 Ω/square. The highly concentrated P-type doped polysilicon layer 03B has a thickness of 100 nm, and a sheet resistance of 50 Ω/square.

The first conductive film layer 06N and the second conductive film layer 06P are a transparent conductive film layer.

The transparent conductive film layer is an IGZO film layer.

The first conductive film layer 06N has a thickness of 60 nm. The second conductive film layer 06P has a thickness of 55 nm.

The N-type semiconductor film layer 05 is an N-type microcrystalline laminated layer.

The N-type microcrystalline laminated layer includes oxygen-free microcrystalline layer 05C, oxygen-containing microcrystalline layer 05B, and oxygen-free incubation layer 05A that are sequentially stacked from the light-facing surface to the backlight surface. Each film layer of the N-type microcrystalline laminated layer is deposited by stepwise increasing a ratio of an N-type dopant gas to silane.

The first conductive film layer 06N has a refractive index of 1.8, and the N-type semiconductor film layer 05 has a refractive index of 2.6.

Embodiment 5

Figure 20:
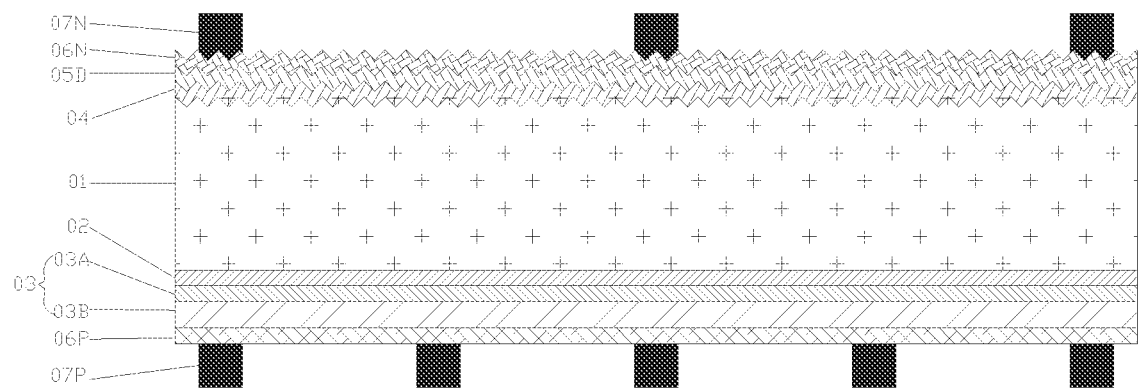
FIG. 20 is a schematic structural view of a heterojunction solar cell according to Embodiment 5 of the present disclosure.

The embodiment differs from Embodiment 4 in: As shown in FIG. 20, the N-type semiconductor film layer is N-type microcrystalline silicon layer 05D. The N-type microcrystalline silicon layer 05D is an oxygen-free single film layer.

Embodiment 6

Figure 21:
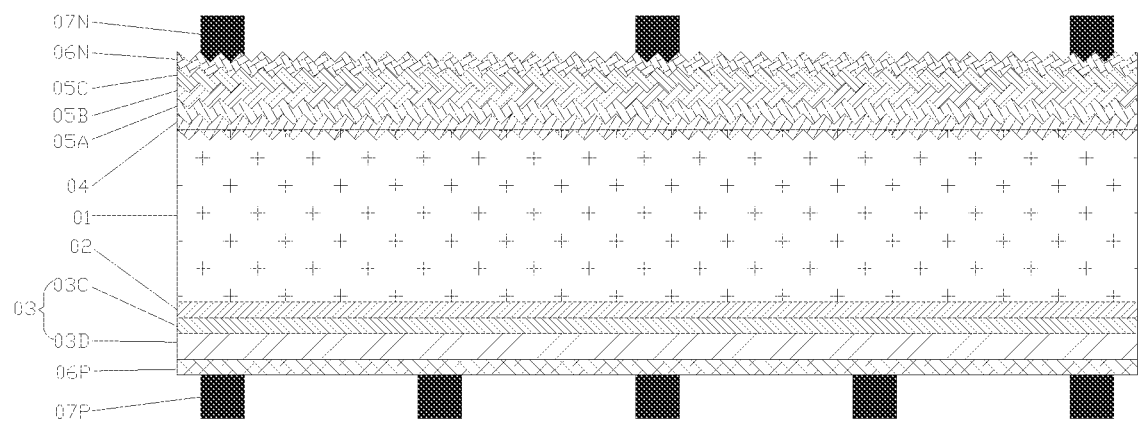
FIG. 21 is a schematic structural view of a heterojunction solar cell according to Embodiment 6 of the present disclosure.

The embodiment differs from Embodiment 4 in: As shown in FIG. 21, the P-type carbon-doped semiconductor film layer is P-type carbon-doped microcrystalline silicon layer 03C. The highly concentrated P-type doped semiconductor film layer is highly concentrated P-type doped microcrystalline silicon layer 03D.

Embodiment 7

Figure 22:
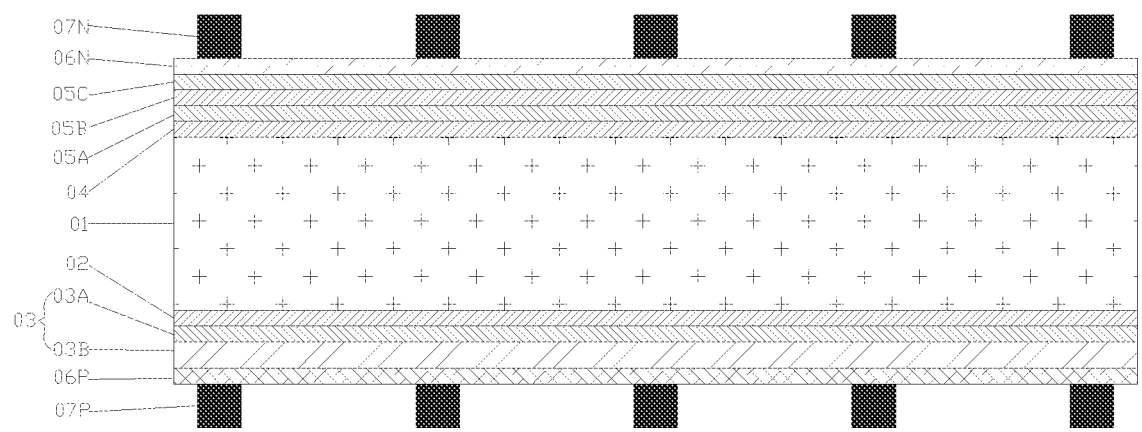
FIG. 22 is a schematic structural view of a heterojunction solar cell according to Embodiment 7 of the present disclosure.

The embodiment differs from Embodiment 4 in: As shown in FIG. 22, the pyramid texture is not provided on the light-facing surface of the semiconductor substrate 01.

Comparative Embodiment 1

Figure 23:
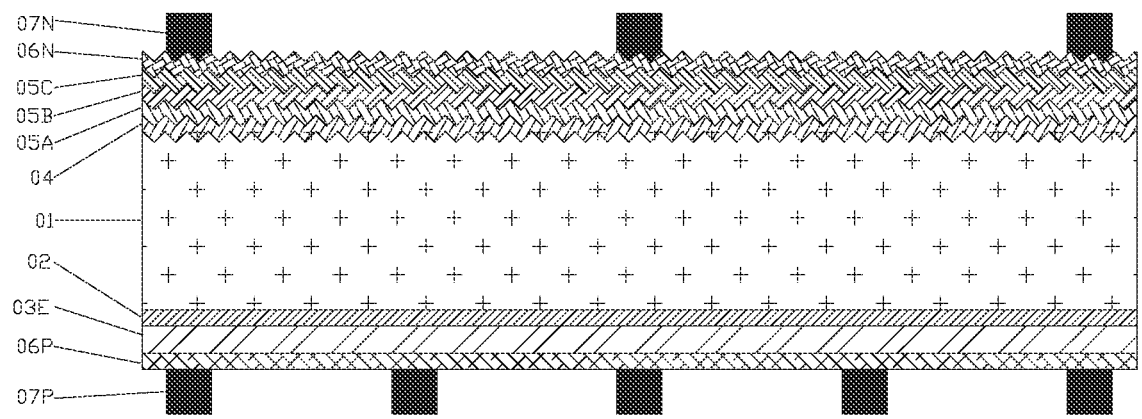
FIG. 23 is a schematic structural view of a heterojunction solar cell according to Comparative Embodiment 1 of the present disclosure.

The comparative embodiment differs from Embodiment 4 only in: As shown in FIG. 23, the P-type semiconductor film layer is P-type polysilicon layer 03E.

Comparative Embodiment 2

The comparative embodiment differs from Embodiment 5 only in: The first conductive film layer has a refractive index of 1.95, and the N-type semiconductor film layer has a refractive index of 3.3.

|  | Isc/KA | Voc/V | FF | Eta |
|---|---|---|---|---|
| Embodiment 4 | 1 | 1 | 1 | 1 |
| Embodiment 5 | 0.92 | 1 | 1 | 0.92 |
| Embodiment 6 | 1.01 | 1 | 0.97 | 0.9797 |
| Embodiment 7 | 0.85 | 1 | 0.95 | 0.8075 |
| Comparative Embodiment 1 | 0.97 | 1 | 0.98 | 0.9506 |
| Comparative Embodiment 2 | 0.90 | 1 | 0.98 | 0.9016 |

The above table shows performance test results of solar cells prepared in various embodiments and comparative embodiments. As can be seen from the above table, the short-circuit current Isc, the open-circuit voltage Voc, the fill factor FF and the conversion efficiency Eta of the solar cell prepared in the embodiment of the present disclosure are all at a high level.

According to the above embodiment of the present disclosure, the N-type oxygen-doped microcrystalline silicon layer is used by a window layer on the front surface. Therefore, a wider optical band gap and a less optical loss are achieved. With comparison on a light-facing surface of the front surface, the heterojunction microcrystalline solution with a same thickness has more excellent response to PVD sputtering, and can keep a higher passivation level and a higher final conversion efficiency.

The above are merely preferred examples of the present disclosure, and not intended to limit the present disclosure. Any modifications, equivalent replacements, and improvements made within the spirit and principle of the present disclosure should fall within the protection scope of the present disclosure.

What is claimed is:

1. A manufacturing method of a heterojunction solar cell, wherein the heterojunction solar cell comprises a first electrode, a first conductive film layer, an N-type semiconductor film layer, an intrinsic film layer, a semiconductor substrate, a tunnel oxide layer, a P-type carbon-doped semiconductor film layer, a concentrated P-type doped semiconductor film layer, a second conductive film layer, and a second electrode sequentially stacked from a light-facing surface to a backlight surface, wherein the first conductive film layer completely covers the N-type semiconductor film layer; the first electrode is electrically connected to the N-type semiconductor film layer through the first conductive film layer; the second conductive film layer completely covers the concentrated P-type doped semiconductor film layer; and the second electrode is electrically connected to the concentrated P-type doped semiconductor film layer through the second conductive film layer, wherein the second conductive film layer comprises a transparent conductive film layer, a metal conductive layer, and a protective layer, wherein the transparent conductive film layer has a thickness of 20-100 nm, and the metal conductive layer is made of copper, with a thickness of 100-500 nm, and the protective layer is made of a metal nickel-chromium alloy with a thickness of 30-100 nm, wherein the method comprises the following steps:

A: forming a tunnel oxide layer on a first main surface of a semiconductor substrate;

B: forming a first intrinsic polysilicon layer on the tunnel oxide layer;

C: forming the first intrinsic polysilicon layer into a P-type polysilicon layer by diffusion annealing;

D: removing a borosilicate glass (BSG) layer formed by the diffusion annealing;

E: forming a mask layer on the P-type polysilicon layer;

F: performing texturing and cleaning on a second main surface of the semiconductor substrate, and removing the mask layer;

G: forming a second intrinsic amorphous silicon layer on the second main surface of the semiconductor substrate; and H: forming an N-type oxygen-doped microcrystalline silicon layer on the second intrinsic amorphous silicon layer.

2. The manufacturing method according to claim 1, wherein step C comprises: performing boron doping on the first intrinsic polysilicon layer, wherein boron trichloride or boron tribromide is configured as a doping source; a high-purity oxygen with a purity of greater than 99.9% is configured as an oxygen source; and the diffusion annealing is performed for 90-300 min at 800-1,100° C., wherein the P-type polysilicon layer and the BSG layer are formed.

3. The manufacturing method according to claim 1, wherein step E comprises: depositing at least one of silicon nitride, silicon oxynitride and silicon oxide on the P-type polysilicon layer by plasma-enhanced chemical vapor deposition (PECVD) or high-temperature CVD to form the mask layer.

4. The manufacturing method according to claim 3, wherein the mask layer has a thickness of 30-150 nm.

5. The manufacturing method according to claim 1, wherein step H comprises: forming, by PECVD or hot-wire CVD, the N-type oxygen-doped microcrystalline silicon layer laminated by at least one oxygen-containing microcrystalline layer and at least one oxygen-free microcrystalline layer.

6. The manufacturing method according to claim 5, wherein in step H, each film layer of the N-type oxygen-doped microcrystalline silicon layer is deposited by stepwise increasing a ratio of an N-type dopant gas to silane.

7. The manufacturing method according to claim 1, further comprising the following steps:

I: forming a first conductive film layer on the P-type polysilicon layer, and forming a second conductive film layer on the N-type oxygen-doped microcrystalline silicon layer; and J: forming a first metal electrode on the first conductive film layer, and forming a second metal electrode on the second conductive film layer.

8. The manufacturing method according to claim 1, wherein step F comprises: forming a pyramid texture on the second main surface of the semiconductor substrate through the texturing and the cleaning, and removing the mask layer with a fluorine-containing acidic solution.

9. The manufacturing method according to claim 2, wherein step F comprises: forming a pyramid texture on the second main surface of the semiconductor substrate through the texturing and the cleaning, and removing the mask layer with a fluorine-containing acidic solution.

10. The manufacturing method according to claim 3, wherein step F comprises: forming a pyramid texture on the second main surface of the semiconductor substrate through the texturing and the cleaning, and removing the mask layer with a fluorine-containing acidic solution.

11. The manufacturing method according to claim 4, wherein step F comprises: forming a pyramid texture on the second main surface of the semiconductor substrate through the texturing and the cleaning, and removing the mask layer with a fluorine-containing acidic solution.

12. The manufacturing method according to claim 5, wherein step F comprises: forming a pyramid texture on the second main surface of the semiconductor substrate through the texturing and the cleaning, and removing the mask layer with a fluorine-containing acidic solution.

13. The manufacturing method according to claim 6, wherein step F comprises: forming a pyramid texture on the second main surface of the semiconductor substrate through the texturing and the cleaning, and removing the mask layer with a fluorine-containing acidic solution.

14. A heterojunction solar cell comprising a first electrode, a first conductive film layer, an N-type semiconductor film layer, an intrinsic film layer, a semiconductor substrate, a tunnel oxide layer, a P-type carbon-doped semiconductor film layer, a concentrated P-type doped semiconductor film layer, a second conductive film layer, and a second electrode sequentially stacked from a light-facing surface to a back-light surface,
wherein the first conductive film layer completely covers the N-type semiconductor film layer; the first electrode is electrically connected to the N-type semiconductor film layer through the first conductive film layer; the second conductive film layer completely covers the concentrated P-type doped semiconductor film layer; and the second electrode is electrically connected to the concentrated P-type doped semiconductor film layer through the second conductive film layer, wherein the second conductive film layer comprises a transparent conductive film layer, a metal conductive layer, and a protective layer, wherein the transparent conductive film layer has a thickness of 20-100 nm, and the metal conductive layer is made of copper, with a thickness of 100-500 nm, and the protective layer is made of a metal nickel-chromium alloy with a thickness of 30-100 nm.

15. The heterojunction solar cell according to claim 14, wherein the semiconductor substrate is a monocrystalline silicon wafer; a pyramid texture is provided on the light-facing surface of the semiconductor substrate; and the pyramid texture has a size of 1-10 μm.

16. The heterojunction solar cell according to claim 14, wherein the intrinsic film layer is an intrinsic amorphous silicon layer, and has a thickness of 3-12 nm; and the N-type semiconductor film layer has a thickness of 9-20 nm.

17. The heterojunction solar cell according to claim 14, wherein the second conductive film layer has a thickness of 30-150 nm.

18. The heterojunction solar cell according to claim 14, wherein the first conductive film layer has a refractive index of 1.75-1.9, and the N-type semiconductor film layer has a refractive index of 2.5-2.9.

19. The heterojunction solar cell according to claim 14, wherein the P-type carbon-doped semiconductor film layer is a P-type carbon-doped polysilicon layer, and the concentrated P-type doped semiconductor film layer is a concentrated P-type doped polysilicon layer.

20. The heterojunction solar cell according to claim 19, wherein the tunnel oxide layer has a thickness of 1-3 nm; and the P-type carbon-doped polysilicon layer and the concentrated P-type doped polysilicon layer have a total thickness of 100-250 nm, and a sheet resistance of 30-150 Ω/square.

* * * * *